United States Patent
Asadi et al.

(10) Patent No.: US 11,456,757 B2
(45) Date of Patent: Sep. 27, 2022

(54) OSCILLATION DETECTION AND MITIGATION IN BIT-FLIPPING DECODERS

(71) Applicant: SK hynix Inc., Icheon-si (KR)

(72) Inventors: Meysam Asadi, Fremont, CA (US); Aman Bhatia, San Jose, CA (US); Fan Zhang, Fremont, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/124,203

(22) Filed: Dec. 16, 2020

(65) Prior Publication Data

US 2022/0190845 A1    Jun. 16, 2022

(51) Int. Cl.
*H03M 13/00* (2006.01)
*H03M 13/11* (2006.01)

(52) U.S. Cl.
CPC ...... *H03M 13/116* (2013.01); *H03M 13/1108* (2013.01); *H03M 13/1111* (2013.01); *H03M 13/1128* (2013.01)

(58) Field of Classification Search
CPC ........... H03M 13/116; H03M 13/1108; H03M 13/1111; H03M 13/1128
See application file for complete search history.

(56) References Cited

U.S. PATENT DOCUMENTS

| | | | |
|---|---|---|---|
| 8,132,065 B2 | 3/2012 | Chen et al. | |
| 8,407,553 B2 * | 3/2013 | Gunnam | H03M 13/3738 714/752 |
| 8,484,535 B2 * | 7/2013 | Graef | H03M 13/1102 714/752 |
| 8,645,810 B2 * | 2/2014 | Sharon | H03M 13/1128 714/755 |
| 8,880,987 B2 * | 11/2014 | Sharon | H03M 13/116 714/752 |
| 9,459,956 B2 * | 10/2016 | Hubris | H03M 13/6561 |
| 10,700,706 B2 | 6/2020 | Zhang et al. | |
| 2008/0168319 A1 | 7/2008 | Lee et al. | |
| 2019/0288707 A1 | 9/2019 | Kumar et al. | |
| 2020/0136644 A1 | 4/2020 | Zeng | |
| 2020/0162108 A1 | 5/2020 | Kim et al. | |

* cited by examiner

*Primary Examiner* — Esaw T Abraham
(74) *Attorney, Agent, or Firm* — Perkins Coie LLP

(57) ABSTRACT

Devices, systems, and methods for detecting and mitigating oscillations in a bit-flipping decoder associated with a non-volatile memory are described. An example method includes receiving a noisy codeword based on a transmitted codeword generated from a low-density parity-check code, performing a first plurality of decoding iterations on the noisy codeword, which comprises performing a message passing algorithm in a first order, computing, based on a completion of the first plurality of decoding iterations, a plurality of checksum values and a plurality of bit flip counts corresponding to the first plurality of decoding iterations, determining that the plurality of checksum values and the plurality of bit flip counts are periodic with a period less than a predetermined threshold, and performing a subsequent decoding iteration on the noisy codeword, the subsequent decoding iteration comprising performing the message passing algorithm in a second order different from the first order.

20 Claims, 7 Drawing Sheets

OSCILLATION DETECTION AND MITIGATION IN BIT-FLIPPING DECODERS

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for more efficient decoding approaches that can provide data protection with improved decoding performance.

SUMMARY

Embodiments of the disclosed technology relate to improving decoding performance of bit-flipping decoders associated with a non-volatile memory by detecting oscillations and mitigating them. Detecting and mitigating oscillations in the bit-flipping decoders reduce the failure-rate of the bit-flipping decoders, thereby improving the throughput and read-QoS (quality of service) of the non-volatile memory.

In an example aspect, a method for improving a decoding performance of a bit-flipping decoder is described. The method includes receiving a noisy codeword that is based on a transmitted codeword generated from a low-density parity-check (LDPC) code, performing a first plurality of decoding iterations on the noisy codeword, at least one of the first plurality of decoding iterations comprising performing a message passing algorithm in a first order, computing, based on a completion of the first plurality of decoding iterations, a plurality of checksum values and a plurality of bit flip counts corresponding to the first plurality of decoding iterations, determining that the plurality of checksum values and the plurality of bit flip counts are periodic with a period less than a predetermined threshold (T), and performing a subsequent decoding iteration on the noisy codeword, the subsequent decoding iteration comprising performing the message passing algorithm in a second order different from the first order.

In yet another example aspect, the above-described method may be implemented by a processor coupled to a memory.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Solid state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use irregular quasi-cyclic low-density parity-check (QC-LDPC) codes to correct any bit-errors in pages read from NAND media. QC-LDPC codes are used to ensure data integrity in storage systems that use the new generation of NAND flash memories. Iterative decoders for LDPC code in general, and irregular QC-LDPC codes in particular, have wide range of complexities. The two primary types of decoders are the low-complexity bit-flipping (BF) decoder with low error-correction capability and the high-complexity min-sum (MS) decoder with high error-correction capability.

For typical SSD applications, most page reads (more than 99%) are by the bit-flipping decoder. Thus, designing hardware for fast and efficient bit-flipping (BF) decoder, which exhibits improved convergence properties, is critical especially in mobile and client SSD applications because of their strict power constraints and throughput requirements.

This document first overviews an example of a non-volatile memory system in which bit-flipping decoder can be implemented to decode irregular QC-LDPC codes, and then describes methods, systems and devices to improve the decoding performance of the bit-flipping decoder by, for example, computing the number of bit-flips over a previous number of circulant-columns in the irregular QC-LDPC code and subsequently updating the bit-flipping threshold.

FIGS. 1-6 overview a non-volatile memory system (e.g., flash-based memory or NAND flash) in which embodiments of the disclosed technology may be implemented.

Figure 1:
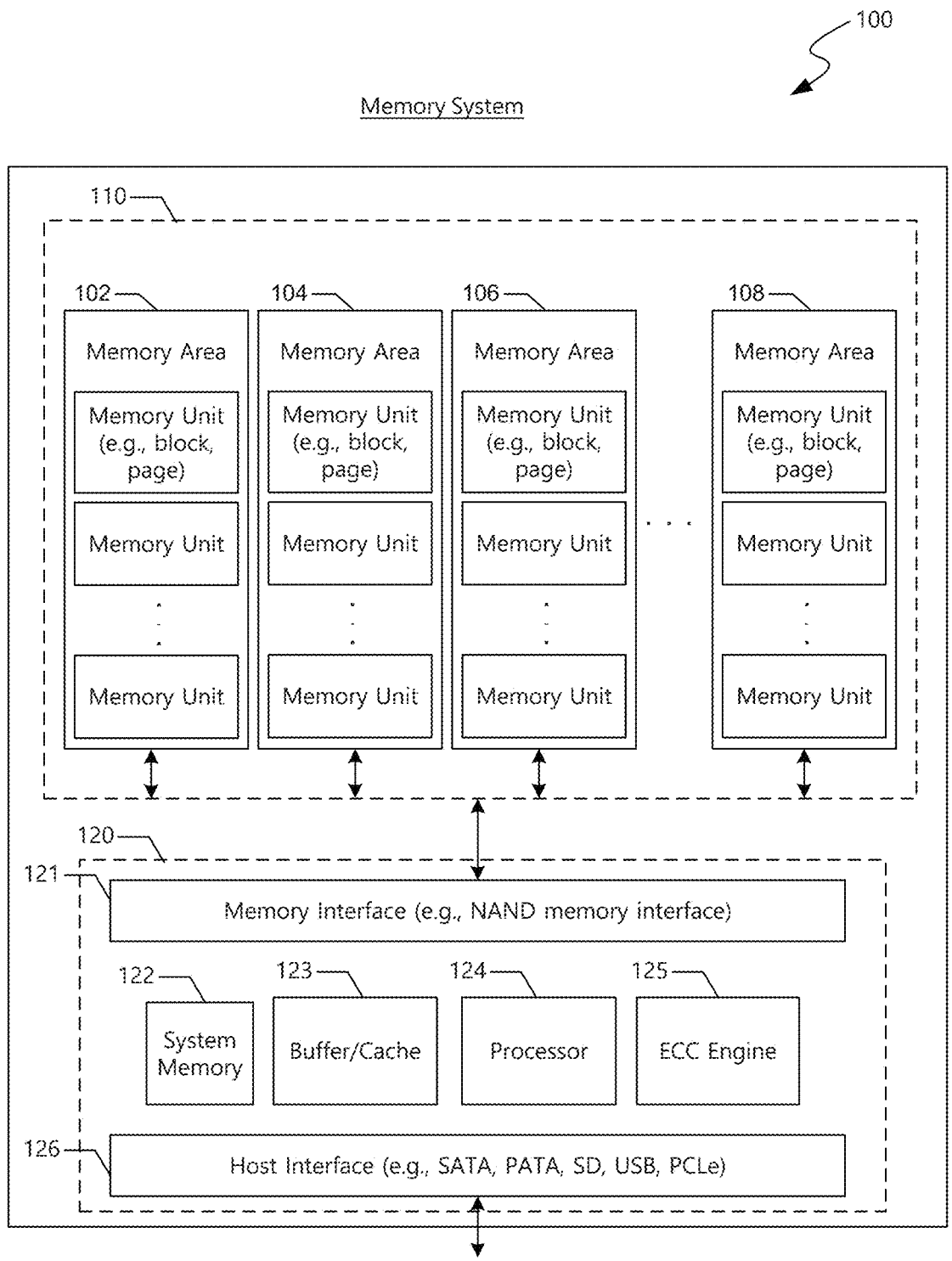
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106 and 108 can be configured to store at least one bit of information (e.g., one bit of information or multiple bits of information), and each of the memory cells in memory area 102, 104, 106 and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
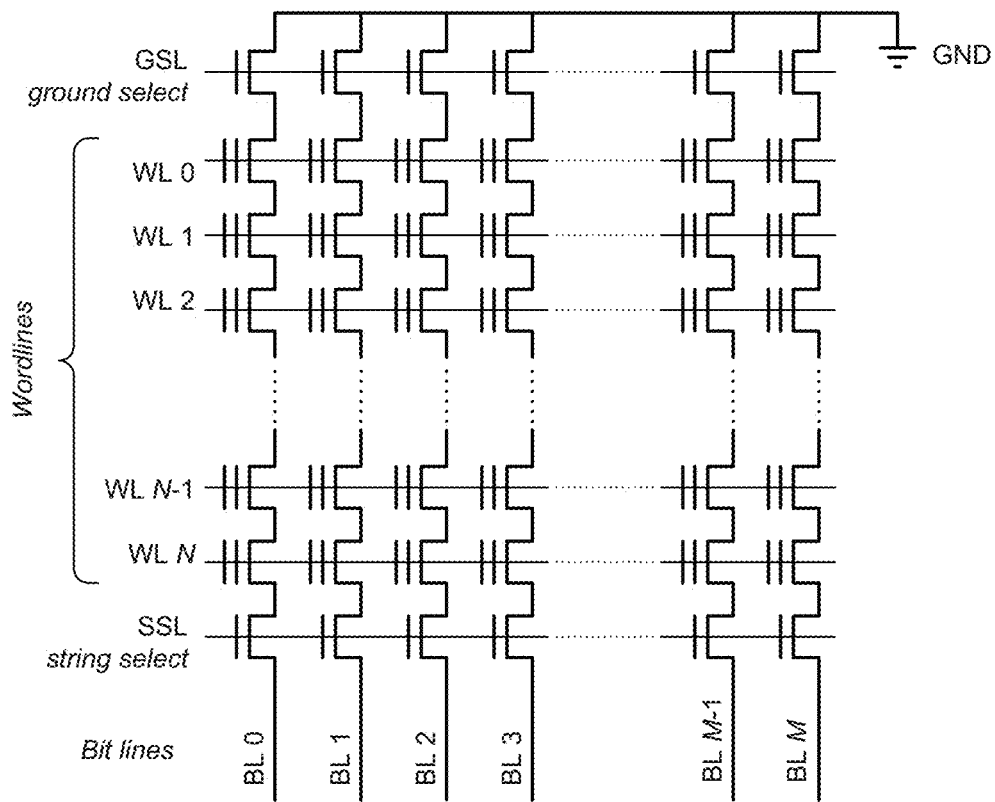
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
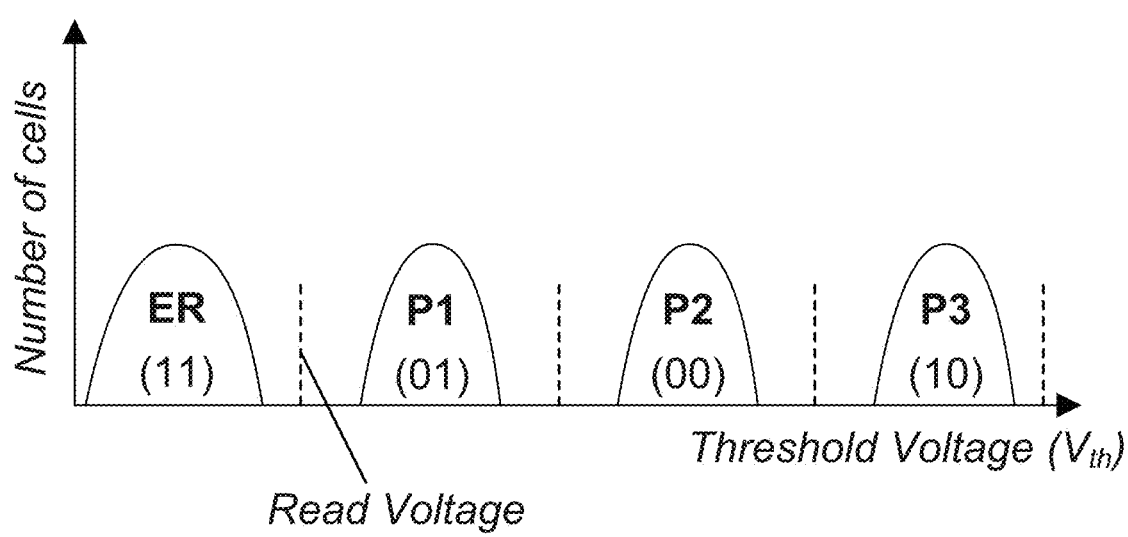
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
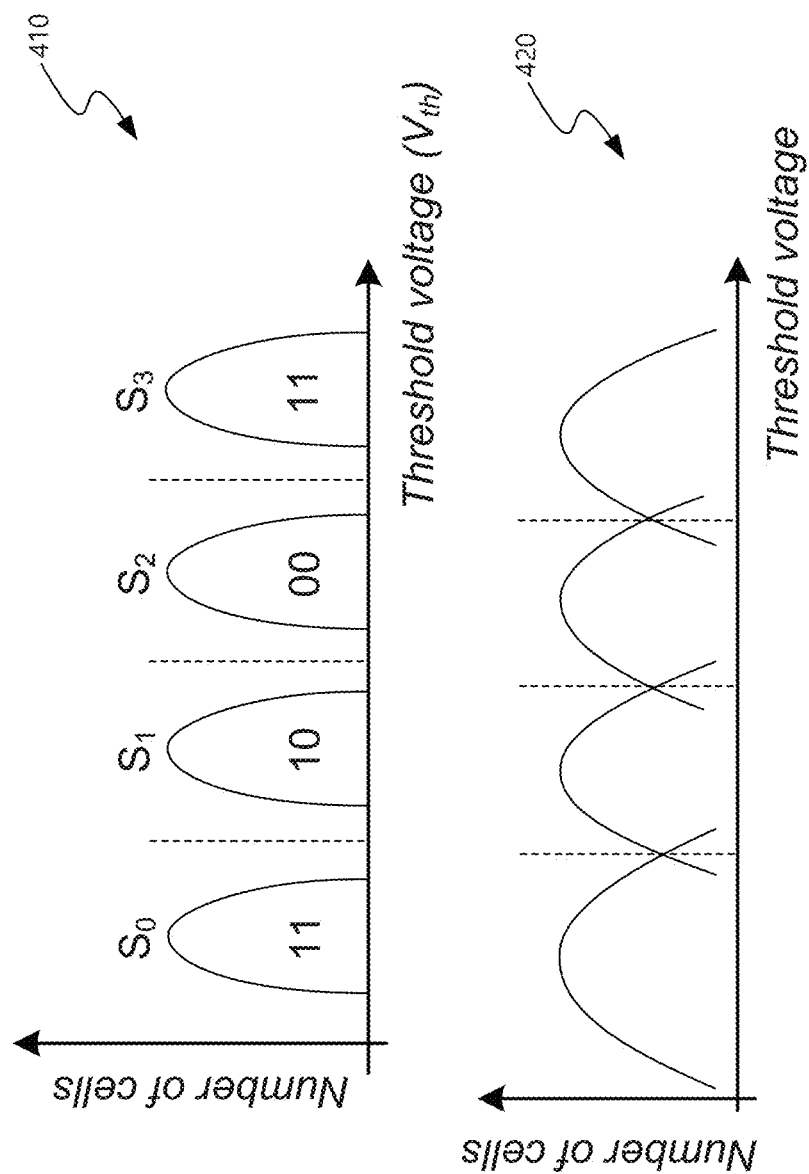
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
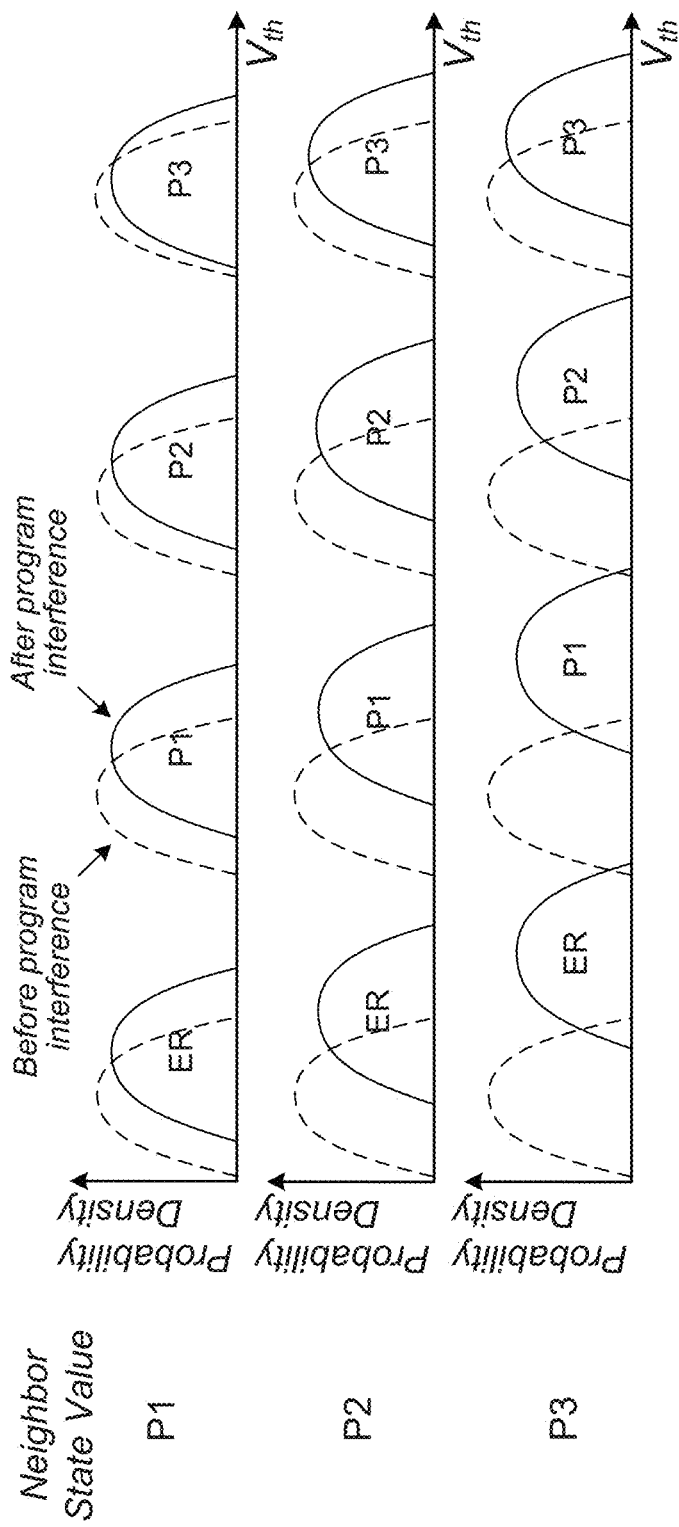
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
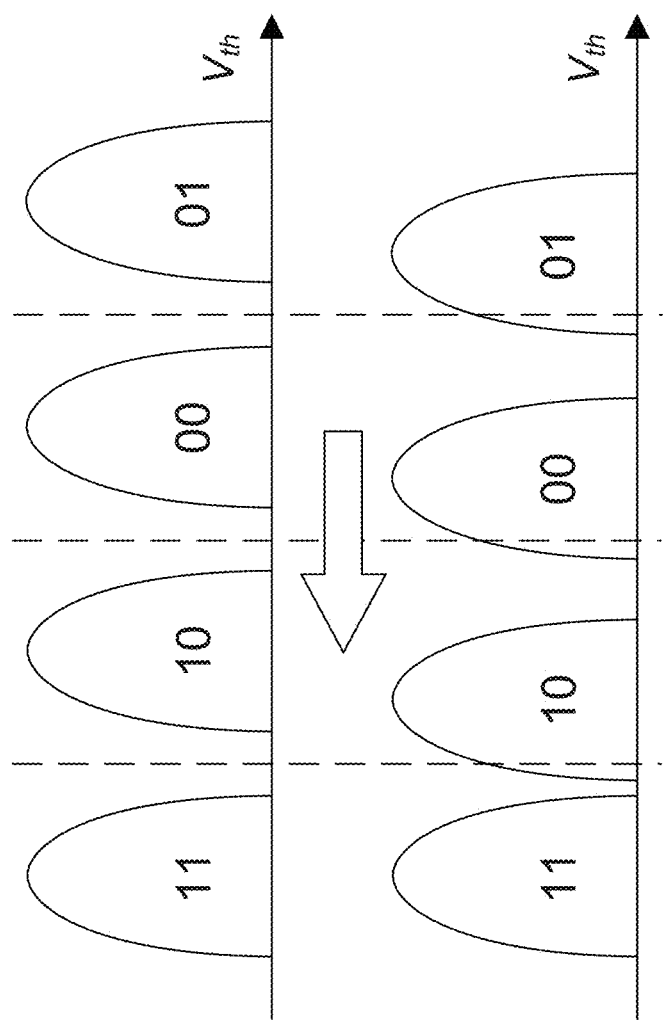
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

Bit-flipping decoders are typically employed as the first step of decoding LDPC codewords in non-volatile memory devices (e.g., as described in FIGS. 1-6) such that a majority of the read traffic can be decoded with a fast, low power decoder. However, for certain error patterns, the bit-flipping decoder may get stuck (or stall) during decoding, e.g., by reaching a certain error pattern and then flip the same set or sequence of bits repeatedly. In these cases, the checksum and the number of flipped bits in each iteration start to oscillate.

According to some embodiments of the disclosed technology, methods, systems, and devices improve a decoding performance of bit-flipping decoder implementations for LDPC codes by detecting and mitigating oscillations that may occur during the decoding process. The embodiments described herein are also applicable to quasi-cyclic LDPC (QC-LDPC) codes.

Quasi-cyclic codes are defined by the property that, for an integer $n_0$, every cyclic shift of a codeword by no places is also a codeword. For a systematic ($n=mn_0$, $k=mk_0$) quasi-cyclic linear code, the corresponding parity check matrix H is represented as.

$$H = \begin{bmatrix} & C'_{1,1} & C'_{1,2} & \cdots & C'_{1,k_0} \\ & C'_{2,1} & C'_{2,2} & \cdots & C'_{2,k_0} \\ I_{n-k} & C'_{3,1} & C'_{3,2} & & C'_{3,k_0} \\ & \vdots & \vdots & & \vdots \\ & C'_{n_0-k_0,1} & C'_{n_0-k_0,2} & \cdots & C'_{n_0-k_0,k_0} \end{bmatrix}$$

Herein, n denotes the length of the code, k denotes the rank of the code (which corresponds to the number of codewords in its basis and the number of rows in its generating matrix), m denotes the size of the circulant matrix, $k_0$ is an integer that is based on the values of n, m and $n_0$, $I_{n-k}$ represents an (n−k)×(n−k) identity matrix, and each $C_{i,j}'$ is a m×m circulant matrix (with size circulantSize or circSize) of the following form:

$$C'_{i,j} = \begin{bmatrix} c_0 & c_1 & c_2 & \cdots & c_{m-1} \\ c_{m-1} & c_0 & c_1 & \cdots & c_{m-2} \\ c_{m-1} & c_{m-1} & c_0 & \cdots & c_{m-3} \\ \vdots & \vdots & \vdots & & \vdots \\ c_1 & c_2 & c_3 & \cdots & c_0 \end{bmatrix}.$$

In contrast to a quasi-cyclic code in which all columns have an equal column weight (e.g., each column has the same number of 1's), an irregular quasi-cyclic code has at least two columns with different numbers of 1's, i.e., columns with different weights.

Both regular and irregular LDPC codes can be represented using a Tanner graph, which includes a set of nodes (or vertices) and a set of edges connecting the nodes. The Tanner graph corresponding to an M×N parity-check matrix contains M variable nodes (or bit nodes) and N check nodes (or check sum nodes), and provides a graphical representation of the parity-check matrix to which is corresponds. The performance and decoding of an LDPC code (regular or irregular) are based on the row-weights and column-weights of the parity-check matrix, or equivalently, the cycles in the Tanner graph representation.

In bit-flipping algorithms, at each iteration and for every variable node, the number of unsatisfied check nodes are compared with a threshold, and the hard decision estimate of the variable node is flipped if the number of unsatisfied check nodes is greater than the threshold. In existing implementations, a bit-flipping decoder typically uses a predetermined scheduling algorithm in which the processing order of the variable nodes in each iteration is fixed. However, some error patterns may be sensitive to the fixed processing order in that if a certain error pattern causes an oscillation, using the same processing order of the variable nodes in each iteration makes it impossible to escape the oscillation and results in an unsuccessful decoding operation.

When such an error occurs, embodiments of the disclosed technology can use one or more decoder parameters (e.g., number of flipped bits, checksum, etc.) to detect an oscillation. In an example, the values of the number of flipped bits and the checksum repeat with a period due to oscillating variable nodes. In this case, the bit-flipping decoder can be configured to use a randomized order to process the variable nodes, thereby enabling the decoder to escape the oscillation to improve decoding performance.

In some embodiments, because determining the period (T) of the decoder parameters may require additional hardware, the randomized order can be implemented only if the period of the oscillation is less than a predetermined threshold. In an example, T≤10.

For a majority of error patterns, oscillations in bit-flipping detectors are caused due to the processing order of the variable nodes. Thus, changing the flipping order of the variable nodes may assist the decoder in escaping from the oscillations. However, in traditional non-volatile memories (e.g., the example implementations described in FIGS. 1-6), changing the processing order of the variable nodes by changing the hardware design is practically unfeasible due to the increased complexity of the state machine running the bit-flipping decoder.

An efficient technique of changing the flipping order of the variable nodes in the bit-flipping decoder without changing the hardware design is to stochastically flip the bits that the bit-flipping decoder has configured to flip. That is, the decoder accepts the decision to flip a bit with a certain probability, therein rejecting some of the bit flip decisions. However, a random implementation of this type will typically slow down the bit-flipping decoder.

Embodiments of the disclosed technology use a stochastic decision to accept or reject the bit flipping decision only when an oscillation is detected, thereby reducing any loss in throughput. In an example, when the variables nodes that were flipped during an oscillation are skipped due to the stochastic decision, the decoding trajectory starts to diverge from the previous iterations. This advantageously enables the decoder to escape the oscillation and converge to the correct codeword in a few more iterations. In some embodiments, the stochastic decision may be generated in a pseudo-random manner by a linear feedback shift register (LFSR), which requires minimal hardware resources.

Example Algorithm for Oscillation Detection and Mitigation

For an iterative bit-flipping decoder, assume i ($0 \leq i \leq i_{max}$) represents the iteration number, $d_j^{(i)}$ denotes the decision of variable node j of the $j^{th}$ decoding iteration, $d^{(i)}=[d_0^{(i)}, d_1^{(i)}, \ldots, d_{N-1}^{(i)}]$ is the decision vector at the $i^{th}$ decoding iteration, and the syndrome at $i^{th}$ iteration is $s^{(i)}=[d_0^{(i)}, d_1^{(i)}, \ldots, d_{N-1}^{(i)}]H^T$, where H is the parity-check matrix of the LDPC code.

It is further assumed that $d^{(-1)}=[d_0^{(-1)}, d_1^{(-1)}, \ldots, d_{N-1}^{(-1)}]=y$ is the received word that is used as the initial decision vector, and that $s^{(-1)}=y\,H^T$ is the initial syndrome vector. The following notation is also assumed:

CS_arr[i] is the checksum at the $i^{th}$ decoding iteration;
flip_num_arr[i] is the number of flipped bits at the $i^{th}$ decoding iteration;
T is the periodicity threshold;
p is the probability that the flipping decision is accepted by the decoder; and
$\theta_j^i$ be the threshold for flipping energy for the $j^{th}$ circulant-column in the $i^{th}$ decoding iteration. The example algorithm for oscillation detection and mitigation includes:

Step 0: Set i=0, curr_flip_bits=0 and calculate $s^{(-1)}$ and go to Step 1;
Step 1: i=i+1, if reach max iteration, stop decoding. Otherwise, go to Step 2;
Step 2: if |s|=0, stop decoding. Otherwise, go to Step 3;
Step 3: (oscillation detection)
Store CS_arr[i−1]=|s|, flip_num_arr[i−1]=cur_flip_bits.
Check whether both CS_arr and flip_num_arr are periodic (with period≤T).
If they are both periodic, generate a pseudo-random array P of size $n_{circ}$ bits such that P[j]=1 with probability p.
Else, set P to be 1 for all circulants $1 \leq j \leq n_{circ}$.
Step 4:
Update the flipping energy E[v] for all VNs v in the $j^{th}$ circulant-column.
If P[j] is equal to 1
    flip the hard decision estimate for VNs with flipping energy E[v]>$\theta_j^i$
else
    skip $j^{th}$ circulant (oscillation mitigation)
Add the number of bits flipped to cur_flip_bits.
Compute and update s.
Step 5: Go to Step 1

Figure 7:
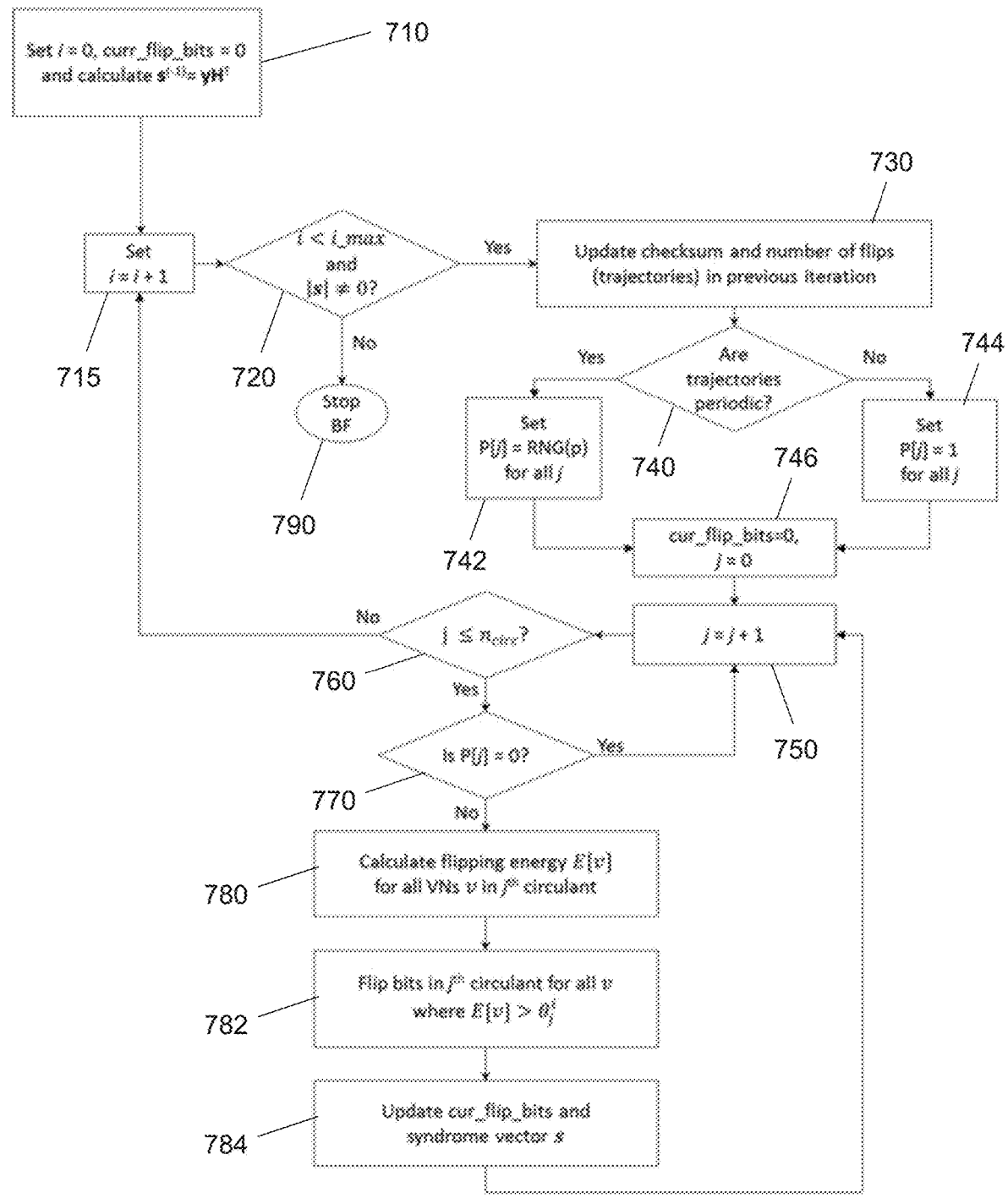
FIG. 7 illustrates a flowchart for oscillation detection and mitigation.

FIG. 7 illustrates a flowchart for a method for oscillation detection and mitigation. As illustrated therein, the method 700 begins at operation 710, where i is set to 0, curr_flip_bits is set to 0, and $s^{(-1)}=y\,H^T$ is calculated, and which corresponds to Step 0 described above.

In operation 715, i is incremented and the method determines whether decoding should continue by checking, in operation 720, whether the maximum number of iterations has been exceeded or the syndrome is zero, and which corresponds to Steps 1 and 2 described above.

If the maximum number of iterations has been exceeded or the syndrome is zero, the bit-flipping decoder is stopped in operation 790 ("No" branch in 720). Otherwise, decoding continues with operation 730 ("Yes" branch in 720).

In operation 730, the checksum (denoted CS_arr[i] for the $i^{th}$ decoding iteration) and the number of flips (denoted flip_num_arr[i] for the $i^{th}$ decoding iteration, and equivalent to the trajectories of the bit flips) in the previous iteration are updated.

In operation 740, method 700 checks whether the trajectories are periodic. In an example, the periodicity of the trajectories must be lower than a predetermined threshold. If the trajectories are periodic ("Yes" branch in 740), P[j] for all j are set to a probability generated by the random number generator (RNG) in operation 742. On the other hand, if the trajectories are not periodic ("No" branch in 740), P[j] for all j are set to 1 in operation 744. The method continues with operation 746, wherein the number of bit currently flipped (cur_flip_bits) and the circulant-column index (j) are set to 0.

In operation 750, the circulant-column index (j) is incremented, and in operation 760, the method determines whether all the circulant-columns have been processed, i.e., checking whether j is less than or equal to $n_{circ}$ (the number of circulant-columns). If all the circulant-columns have been processed ("No" branch in 760), the algorithm begins the next iteration (by incrementing the circulant-column index i in operation 715), but if at least one circulant-column has not been processed ("Yes" branch in 760), the method continues to operation 770.

In operation 770, the method checks with the randomly assigned probability for the $j^{th}$ circulant-column is equal to 0. If it is ("Yes" branch in 770), then the stochastic decision process will never flip the bit associated with the $j^{th}$ variable node, and the method loops back to operation 750 to process the next circulant-column. However, if the probability P[j] is non-zero ("No" branch in 770), then (i) the flipping energy E[v] is calculated for all variable nodes v in the $j^{th}$ circulant (operation 780), (ii) the bits in the $j^{th}$ circulant for all v where $E[v] > \theta_j^i$ are flipped (operation 782), and (iii) the number of bit currently flipped (cur_flip_bits) and the syndrome vector are updated. The method 700 then loops back to operation 750 to process the next circulant-column.

In method 700, operations 730-760 correspond to Step 3 described above, and the remainder of the operations illustrated in FIG. 7 correspond to Steps 4 and 5 described above.

In some embodiments, the example algorithm for oscillation detection and mitigation (and as described in FIG. 7) are applicable to both LDPC codes and QC-LDPC codes.

In some embodiments, the example algorithm for oscillation detection and mitigation (and as described in FIG. 7) are applicable in bit-flipping decoders that use more than 1 bit to store the estimates for each variable node.

In some embodiments, a bit array is used to store the circulant-columns that are flipped in iterations after an oscillation is detected. At the start of the new period, P values for other circulant-columns is kept as 1 and only the variable nodes that were flipped during the entire period use pseudo-random bits for their corresponding elements in the P array.

Figure 8:
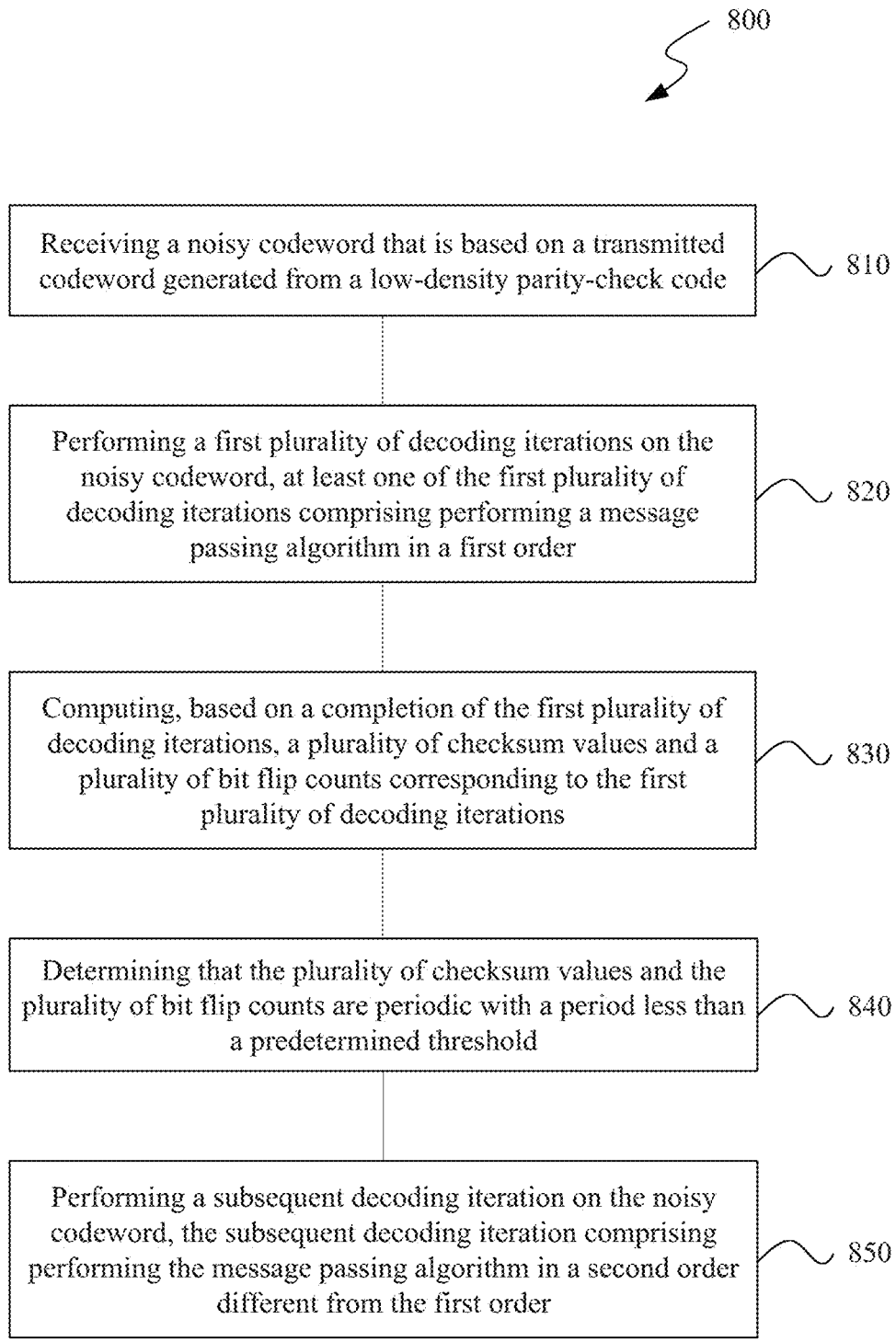
FIG. 8 illustrates a flowchart of an example method for improving the decoding performance of a bit-flipping decoder associated with a non-volatile memory.

FIG. 8 illustrates a flowchart of a method for improving the decoding performance of a bit-flipping decoder associated with a non-volatile memory based on detecting and mitigating oscillations. The method 800 includes, at operation 810, receiving a noisy codeword that is based on a transmitted codeword generated from a low-density parity-check (LDPC) code.

The method 800 includes, at operation 820, performing a first plurality of decoding iterations on the noisy codeword, at least one of the first plurality of decoding iterations comprising performing a message passing algorithm in a first order.

The method 800 includes, at operation 830, computing, based on a completion of the first plurality of decoding iterations, a plurality of checksum values and a plurality of bit flip counts corresponding to the first plurality of decoding iterations.

The method 800 includes, at operation 840, determining that the plurality of checksum values and the plurality of bit flip counts are periodic with a period less than a predetermined threshold (T).

The method 800 includes, at operation 850, performing a subsequent decoding iteration on the noisy codeword, the subsequent decoding iteration comprising performing the message passing algorithm in a second order different from the first order.

In some embodiments, each decoding iteration of the first plurality of decoding iterations comprises passing one or more messages between a plurality of variable nodes and a plurality of check nodes that represent a parity check matrix of the LDPC code.

In some embodiments, the bit-flipping decoder uses two or more bits to store estimates for each of the plurality of variable nodes.

In some embodiments, the first order comprises a first decoding order of the plurality of variable nodes in the decoding iteration, and the second order comprises a second decoding order of the plurality of variable nodes in the decoding iteration.

In some embodiments, the subsequent decoding iteration comprises performing the message passing algorithm N times on each of N circulant columns that comprise a parity check matrix of the LDPC code, and N is an integer.

In some embodiments, the method 800 further includes the operations of determining the second order based on generating a pseudo-random array of bits of length N, wherein each bit of the pseudo-random array of bits has a value of one with probability p, and wherein the second order comprises flipping a bit when a corresponding bit in the pseudo-random array of bits has a value of one.

In some embodiments, p=0.8 and T=10.

In some embodiments, the method 800 further includes the operations of computing a syndrome, and refraining from performing, after the subsequent decoding iteration, an additional decoding iteration of the bit-flipping decoder upon a determination that a maximum number of iterations has been performed or that the syndrome is equal to zero.

In some embodiments, the LDPC code is an irregular QC-LDPC code.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a decoding performance of a bit-flipping decoder associated with a non-volatile memory, comprising:
    receiving a noisy codeword that is based on a transmitted codeword generated from a low-density parity-check (LDPC) code;
    performing a first plurality of decoding iterations on the noisy codeword, at least one of the first plurality of decoding iterations comprising performing a message passing algorithm in a first order;
    computing, based on a completion of the first plurality of decoding iterations, a plurality of checksum values and a plurality of bit flip counts corresponding to the first plurality of decoding iterations;
    determining that the plurality of checksum values and the plurality of bit flip counts are periodic with a period less than a predetermined threshold (T); and
    performing a subsequent decoding iteration on the noisy codeword, the subsequent decoding iteration comprising performing the message passing algorithm in a second order different from the first order.

2. The method of claim 1, wherein each decoding iteration of the first plurality of decoding iterations comprises passing one or more messages between a plurality of variable nodes and a plurality of check nodes that represent a parity check matrix of the LDPC code.

3. The method of claim 2, wherein the bit-flipping decoder uses two or more bits to store estimates for each of the plurality of variable nodes.

4. The method of claim 2, wherein the first order comprises a first decoding order of the plurality of variable nodes in the decoding iteration, and wherein the second order comprises a second decoding order of the plurality of variable nodes in the decoding iteration.

5. The method of claim 1, wherein the subsequent decoding iteration comprises performing the message passing algorithm N times on each of N circulant columns that comprise a parity check matrix of the LDPC code, and wherein N is an integer.

6. The method of claim 5, further comprising:
    determining the second order based on generating a pseudo-random array of bits of length N, wherein each bit of the pseudo-random array of bits has a value of one with probability p, and wherein the second order comprises flipping a bit when a corresponding bit in the pseudo-random array of bits has a value of one.

7. The method of claim 6, wherein p=0.8 and T=10.

8. The method of claim 1, further comprising:
    computing a syndrome; and
    refraining from performing, after the subsequent decoding iteration, an additional decoding iteration of the bit-flipping decoder upon a determination that a maximum number of iterations has been performed or that the syndrome is equal to zero.

9. The method of claim 1, wherein the LDPC code is an irregular quasi-cyclic low-density parity-check (QC-LDPC) code.

10. A system for improving a decoding performance of a bit-flipping decoder associated with a non-volatile memory, comprising:

a processor and a memory including instructions stored thereupon, wherein the instructions upon execution by the processor cause the processor to:
- receive a noisy codeword that is based on a transmitted codeword generated from an irregular quasi-cyclic low-density parity-check (QC-LDPC) code;
- perform a first plurality of decoding iterations on the noisy codeword, at least one of the first plurality of decoding iterations comprising performing a message passing algorithm in a first order;
- compute, based on a completion of the first plurality of decoding iterations, a plurality of checksum values and a plurality of bit flip counts corresponding to the first plurality of decoding iterations;
- determine that the plurality of checksum values and the plurality of bit flip counts are periodic with a period less than a predetermined threshold (T); and
- perform a subsequent decoding iteration on the noisy codeword, the subsequent decoding iteration comprising performing the message passing algorithm in a second order different from the first order.

11. The system of claim 10, wherein each decoding iteration of the first plurality of decoding iterations comprises passing one or more messages between a plurality of variable nodes and a plurality of check nodes that represent a parity check matrix of the QC-LDPC code.

12. The system of claim 11, wherein the first order comprises a first decoding order of the plurality of variable nodes in the decoding iteration, and wherein the second order comprises a second decoding order of the plurality of variable nodes in the decoding iteration.

13. The system of claim 10, wherein the subsequent decoding iteration comprises performing the message passing algorithm N times on each of N circulant columns that comprise a parity check matrix of the QC-LDPC code, and wherein N is an integer.

14. The system of claim 13, wherein the instructions upon execution by the processor configure the process to:
- determine the second order based on generating a pseudo-random array of bits of length N, wherein each bit of the pseudo-random array of bits has a value of one with probability p, and wherein the second order comprises flipping a bit when a corresponding bit in the pseudo-random array of bits has a value of one.

15. The system of claim 14, wherein p=0.8 and T=10.

16. A non-transitory computer-readable storage medium having instructions stored thereupon for improving a decoding performance of a bit-flipping decoder associated with a non-volatile memory, comprising:
- instructions for receiving a noisy codeword that is based on a transmitted codeword generated from a quasi-cyclic low-density parity-check (QC-LDPC) code;
- instructions for performing a first plurality of decoding iterations on the noisy codeword, at least one of the first plurality of decoding iterations comprising performing a message passing algorithm in a first order;
- instructions for computing, based on a completion of the first plurality of decoding iterations, a plurality of checksum values and a plurality of bit flip counts corresponding to the first plurality of decoding iterations;
- instructions for determining that the plurality of checksum values and the plurality of bit flip counts are periodic with a period less than a predetermined threshold (17); and
- instructions for performing a subsequent decoding iteration on the noisy codeword, the subsequent decoding iteration comprising performing the message passing algorithm in a second order different from the first order.

17. The storage medium of claim 16, wherein each decoding iteration of the first plurality of decoding iterations comprises passing one or more messages between a plurality of variable nodes and a plurality of check nodes that represent a parity check matrix of the QC-LDPC code, wherein the first order comprises a first decoding order of the plurality of variable nodes in the decoding iteration, and wherein the second order comprises a second decoding order of the plurality of variable nodes in the decoding iteration.

18. The storage medium of claim 17, wherein the bit-flipping decoder uses two or more bits to store estimates for each of the plurality of variable nodes.

19. The storage medium of claim 16, wherein the subsequent decoding iteration comprises performing the message passing algorithm N times on each of N circulant columns that comprise a parity check matrix of the QC-LDPC code, and wherein N is an integer.

20. The storage medium of claim 19, further comprising:
- instructions for determining the second order based on generating a pseudo-random array of bits of length N, wherein each bit of the pseudo-random array of bits has a value of one with probability p, and wherein the second order comprises flipping a bit when a corresponding bit in the pseudo-random array of bits has a value of one.

* * * * *